(12) United States Patent
Liao

(10) Patent No.: US 11,632,882 B2
(45) Date of Patent: Apr. 18, 2023

(54) HEAT DISSIPATING MODULE AND MOTOR CONTROLLER THEREOF

(71) Applicant: LSC Ecosystem Corporation, Taoyuan (TW)

(72) Inventor: Tzu-Wen Liao, Taoyuan (TW)

(73) Assignee: LSC Ecosystem Corporation, Taoyuan (TW)

( * ) Notice: Subject to any disclaimer, the term of this patent is extended or adjusted under 35 U.S.C. 154(b) by 0 days.

(21) Appl. No.: 17/225,118

(22) Filed: Apr. 8, 2021

(65) Prior Publication Data

US 2021/0321546 A1 Oct. 14, 2021

Related U.S. Application Data

(60) Provisional application No. 63/008,825, filed on Apr. 12, 2020.

(30) Foreign Application Priority Data

Sep. 29, 2020 (TW) ................................ 109212857

(51) Int. Cl.
*H05K 7/20* (2006.01)
*B33Y 80/00* (2015.01)
*F28F 3/12* (2006.01)

(52) U.S. Cl.
CPC ..... *H05K 7/20927* (2013.01); *H05K 7/20254* (2013.01); *B33Y 80/00* (2014.12); *F28F 3/12* (2013.01)

(58) Field of Classification Search
CPC ............ H05K 7/20927; H05K 7/20254; H01L 23/473; F28F 3/12
See application file for complete search history.

(56) References Cited

U.S. PATENT DOCUMENTS

| 5,159,529 | A | * | 10/1992 | Lovgren | ............ | H05K 7/20636 |
| | | | | | | 361/689 |
| 7,339,788 | B2 | * | 3/2008 | Olesen | ............... | H05K 7/20927 |
| | | | | | | 257/E23.098 |
| 9,609,790 | B2 | * | 3/2017 | Ikeda | ........................ | B60K 6/22 |
| 9,845,999 | B2 | * | 12/2017 | Matsushima | ........... | B23P 11/00 |

(Continued)

FOREIGN PATENT DOCUMENTS

EP 2 207 201 A2 7/2010
EP 2 207 201 A3 5/2013

*Primary Examiner* — Zachary Pape
(74) *Attorney, Agent, or Firm* — Winston Hsu

(57) ABSTRACT

A heat dissipating module includes a heat dissipating substrate, a first structural plate, and a first heat conductive plate. The heat dissipating substrate has an inlet, an outlet, and a first container formed on a top surface of the heat dissipating substrate. The inlet and the outlet are communicated with the first container respectively. The first structural plate has a first channel member and is contained in the first container. The first channel member is communicated with the inlet and the outlet respectively. Heat dissipating liquid flows through the first channel member via the inlet, and flows out of the heat dissipating module via the outlet. The first heat conductive plate covers the first structural plate. The first heat conductive plate is in contact with a heat generating member for conducting heat energy generated by the heat generating member to the heat dissipating liquid.

14 Claims, 4 Drawing Sheets

(56) References Cited

U.S. PATENT DOCUMENTS

| | | | |
|---|---|---|---|
| 10,462,939 B2* | 10/2019 | Ushijima | F28F 9/026 |
| 2007/0240867 A1 | 10/2007 | Amano | |
| 2018/0184543 A1* | 6/2018 | Ando | H01L 23/473 |
| 2019/0162483 A1 | 5/2019 | Ono | |
| 2021/0057307 A1* | 2/2021 | Ushijima | H01L 23/473 |

* cited by examiner

HEAT DISSIPATING MODULE AND MOTOR CONTROLLER THEREOF

CROSS REFERENCE TO RELATED APPLICATIONS

This application claims the benefit of U.S. Provisional Application No. 63/008,825, which was filed on Apr. 12, 2020, and is incorporated herein by reference.

BACKGROUND OF THE INVENTION

1. Field of the Invention

The present invention relates to a heat dissipating module and a motor controller thereof, and more specifically, to a heat dissipating module adopting a liquid cooling method and a motor controller thereof.

2. Description of the Prior Art

In general, a liquid cooling module is commonly applied to a high power motor controller for quickly dissipating heat energy generated by electronic components of the motor controller when the motor controller is working, so as to reduce the working temperature of the electronic components for extending the service life of the motor controller. The liquid cooling module is a major component in an electric vehicle cooling system. The liquid cooling module is directly in contact with heat generating regions of the electronic components of the motor controller, and cooling liquid can flow through the liquid cooling module for dissipating the heat energy from the motor controller.

Thus, it is necessary to form a cooling liquid channel in the liquid cooling module for allowing the cooling liquid to flow therethrough. However, since the liquid cooling module is formed by a metal casting process, the channel size of the liquid cooling module is limited by metal material thickness, so as to cause the problem that the channel size cannot be further reduced due to the excessive metal material thickness. As a result, it is hard to achieve flow rectification of the cooling liquid and improve the heat dissipating efficiency of the liquid cooling module.

SUMMARY OF THE INVENTION

The present invention provides a heat dissipating module. The heat dissipating module includes a heat dissipating substrate, a first structural plate, and a first heat conductive plate. The heat dissipating substrate has an inlet, an outlet, and a first container. The inlet and the outlet are communicated with the first container respectively. The first container is formed on a top surface of the heat dissipating substrate. The first structural plate is contained in the first container. The first structural plate has a first channel member communicated with the inlet and the outlet respectively. A heat dissipating liquid flows through the first channel member via the inlet, and flows out of the heat dissipating module via the outlet. The first heat conductive plate covers the first structural plate. The first heat conductive plate is in contact with a heat generating member for conducting heat energy generated by the heat generating member to the heat dissipating liquid.

The present invention further provides a motor controller adopting a liquid cooling method for controlling power output of an electric vehicle motor. The motor controller includes a heat generating member and a heat dissipating module. The heat dissipating module includes a heat dissipating substrate, a first structural plate, and a first heat conductive plate. The heat dissipating substrate has an inlet, an outlet, and a first container. The inlet and the outlet are communicated with the first container respectively. The first container is formed on a top surface of the heat dissipating substrate. The first structural plate is contained in the first container. The first structural plate has a first channel member communicated with the inlet and the outlet respectively. A heat dissipating liquid flows through the first channel member via the inlet, and flows out of the heat dissipating module via the outlet. The first heat conductive plate covers the first structural plate. The first heat conductive plate is in contact with the heat generating member for conducting heat energy generated by the heat generating member to the heat dissipating liquid.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
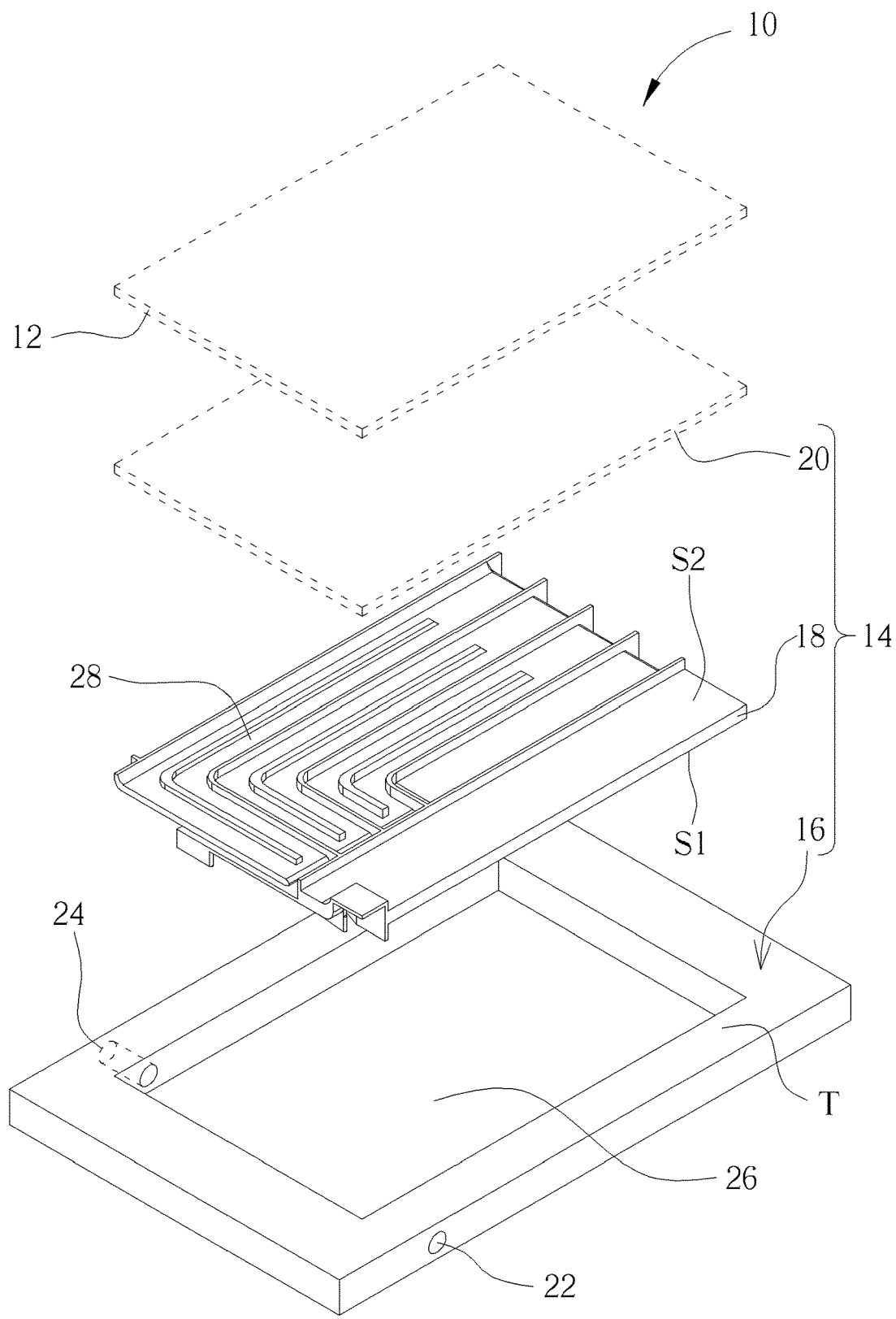
FIG. 1 is an exploded diagram of a motor controller according to an embodiment of the present invention.

Please refer to FIG. 1, which is an exploded diagram of a motor controller 10 according to an embodiment of the present invention. For clearly showing the structural design of a first structural plate 18 of a heat dissipating module 14, a heat generating member 12 and a first heat conductive plate 20 are briefly depicted by dotted lines. In the present invention, the motor controller 10 could be preferably used for controlling power output of an electric vehicle motor. As shown in FIG. 1, the motor controller 10 includes the heat generating member 12 and the heat dissipating module 14. The heat generating member 12 could be an electronic component which can generate heat energy in the motor controller 10, such as a motor controller board (but not limited thereto). The heat dissipating module 14 could preferably adopt a liquid cooling design for performing heat dissipation on the heat generating member 12. To be more specific, the heat dissipating module 14 includes a heat dissipating substrate 16, the first structural plate 18, and the first heat conductive plate 20. The heat dissipating substrate 16 has an inlet 22, an outlet 24, and a first container 26. The inlet 22 and the outlet 24 are communicated with the first container 26 respectively. The first container 26 is formed on a top surface T of the heat dissipating substrate 16. The first structural plate 18 has a first channel member 28 and is contained in the first container 26. The first channel member 28 is communicated with the inlet 22 and the outlet 24 respectively. The first heat conductive plate 20 covers the first structural plate 18 and is in contact with the heat generating member 12. Via the aforesaid design, heat dissipating liquid (preferably cooling liquid, such as water) can flow through the first channel member 28 via the inlet 22 and flow out of the heat dissipating module 14 via the outlet 24.

During this process, the first heat conductive plate 20, which covers the first structural plate 18 and is in contact with the heat generating member 12, can conduct the heat energy generated by the heat generating member 12 to the heat dissipating liquid for achieving the liquid cooling effect.

The heat dissipating substrate 16 could be preferably a metal component having a high heat conductive coefficient. The first heat conductive plate 20 could be preferably an aluminum substrate. The first structural plate 18 could be preferably a plastic component formed by an injection molding process or a 3D printing process. The first structural plate 18 could be preferably made of plastic material commonly applied to a plastic molding process, such as PET, PP, ABS, PEEK, PSU, PPSU, PEI, PVDF, PC, PA66, PPE, and PPS, and the minimum structural thickness of the first structural plate 18 can reach to 0.2-0.3 mm, which is much less than the optimum thickness (i.e. 3 mm) achieved by a metal casting process. In such a manner, via the aforesaid two-piece structural design that the first structural plate 18 is formed by a plastic molding process and is contained in the heat dissipating substrate 16, the present invention can provide a channel structure of a finer size for achieving a preferable flow rectification effect, so as to greatly improve the heat dissipating efficiency of the motor controller 10 and reduce the flow resistance of the heat dissipating module 14. That is, in a case where the same pressure source (e.g. a pump) is to be used, the present invention can increase the volume flow rate of the heat dissipating liquid, so as to further enhance the heat dissipating efficiency of the heat dissipating liquid.

Figure 2:
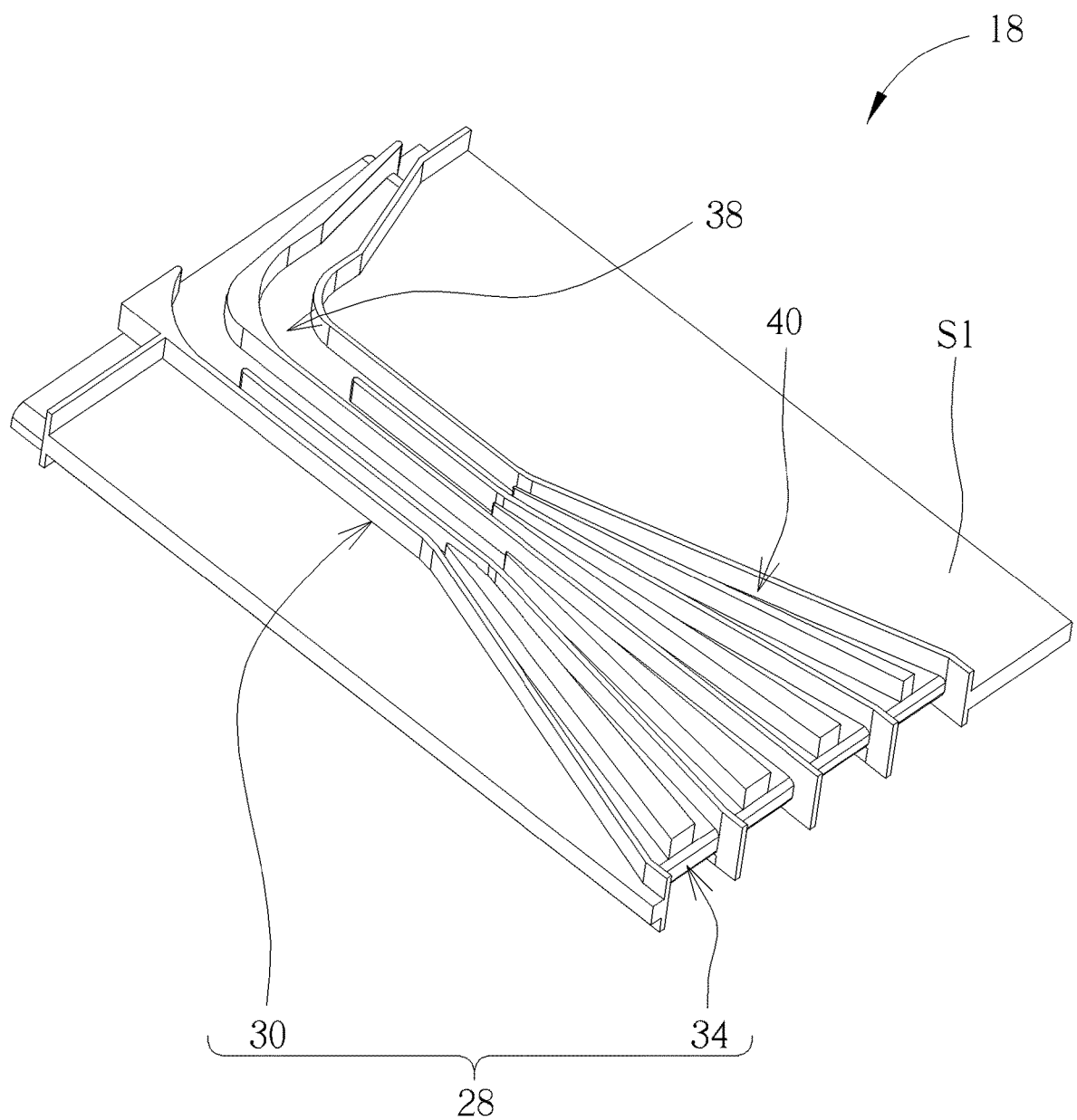
FIG. 2 is an enlarged diagram of a first structural plate in FIG. 1.
Figure 3:
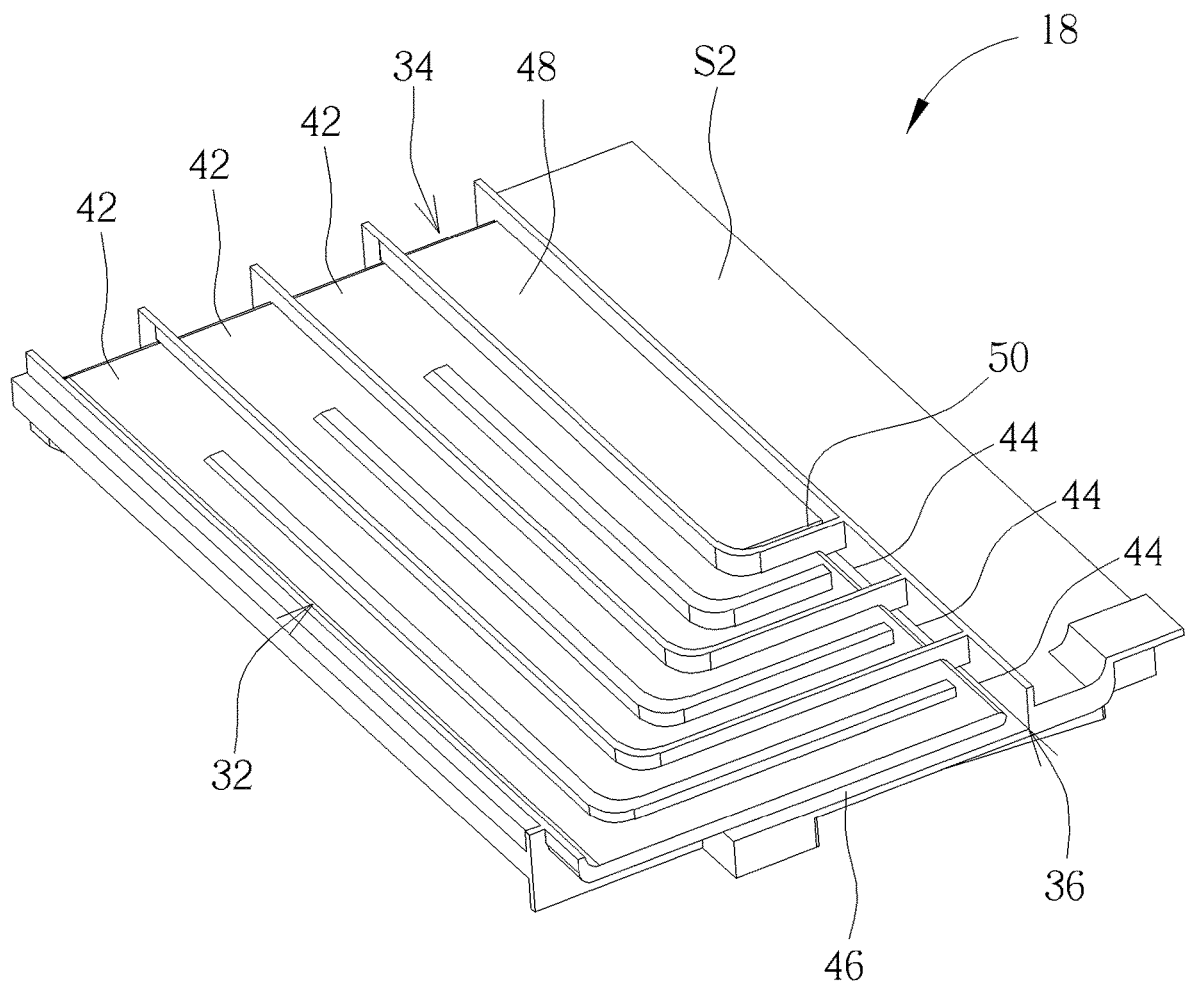
FIG. 3 is an enlarged diagram of the first structural plate in FIG. 1 at another viewing angle.

More detailed description for the heat dissipating channel design of the first structural plate 18 is provided as follows. Please refer to FIGS. 1-3. FIG. 2 is an enlarged diagram of the first structural plate 18 in FIG. 1. FIG. 3 is an enlarged diagram of the first structural plate 18 in FIG. 1 at another viewing angle. As shown in FIGS. 1-3, the first channel member 28 includes a first flow guiding structure 30, a second flow guiding structure 32, a first vertical channel structure 34, and a second vertical channel structure 36.

As shown in FIG. 1 and FIG. 2, the first flow guiding structure 30 is formed on a first surface S1 of the first structural plate 18 facing the first container 26 and is communicated with the inlet 22 and the first vertical channel structure 34. In this embodiment, the first flow guiding structure 30 could have a curved splitting section 38 and a radial splitting section 40. The curved splitting section 38 is communicated with the inlet 22, and the radial splitting section 40 is communicated with the curved splitting section 38 and the first vertical channel structure 34. Accordingly, the heat dissipating liquid can flow from the inlet 22 into the first vertical channel structure 34 by flowing through the curved splitting section 38 and the radial splitting section 40 sequentially. During this process, turbulence of the heat dissipating liquid can be efficiently eliminated via the curved splitting section 38, so as to generate the flow rectification effect for improving the heat conductive efficiency of the heat dissipating liquid. Moreover, the heat dissipating liquid can flow into the first vertical channel structure 34 more evenly via the radial splitting section 40. As for the curvature design of the curved splitting section 38 and the splitting channel design (e.g. the splitting rib configuration) of the first flow guiding structure 30, they are not limited to FIG. 2 and may be modified according to the practical application of the heat dissipating module 14.

As shown in FIG. 1 and FIG. 3, the second flow guiding structure 32 is formed on a second surface S2 of the first structural plate 18 facing the first heat conductive plate 20 and is communicated with the first vertical channel structure 34 and the second vertical channel structure 36. To be more specific, in this embodiment, the second flow guiding structure 32 could have a plurality of curved channels 42. Each curved channel 42 is communicated with the first vertical channel structure 34, and the second vertical channel structure 36 is communicated with each curved channel 42 and the outlet 24. As such, the heat dissipating liquid can flow from the first vertical channel structure 34 to the outlet 24 by flowing through the plurality of curved channels 42 and the second vertical channel structure 36 sequentially.

In practical application, for further enhancing the flow rectification effect, the second vertical channel structure 36 could be formed between the first flow guiding structure 30 and the second flow guiding structure 32 (as shown in FIG. 3) and could have a plurality of first vertical channel sections 44 and a flow collection section 46. The plurality of first vertical channel sections 44 is communicated with the plurality of curved channels 42 respectively, and the flow collection section 46 is communicated with the plurality of first vertical channel sections 44 and the outlet 24. Accordingly, the heat dissipating liquid flowing through the plurality of curved channels 42 and the plurality of first vertical channel sections 44 sequentially can join together in the flow collection section 46 and flow toward the outlet 24. Furthermore, as shown in FIG. 3, the second flow guiding structure 32 could further have a linear channel 48, and the second vertical channel structure 36 could further have a second vertical channel section 50. The second vertical channel section 50 is communicated with the linear channel 48 and the plurality of first vertical channel sections 44. Accordingly, the heat dissipating liquid flowing out of the first vertical channel structure 34 also flows into the second vertical channel section 50 through the linear channel 48, and joins together with the heat dissipating liquid flowing from the plurality of curved channels 42 into the plurality of the first vertical channel sections 44. In such a manner, a contact area between the heat dissipating liquid and the first heat conductive plate 20 can be increased due to forming of the linear channel 48 for further improving the heat dissipating efficiency of the heat dissipating module 14.

Figure 4:
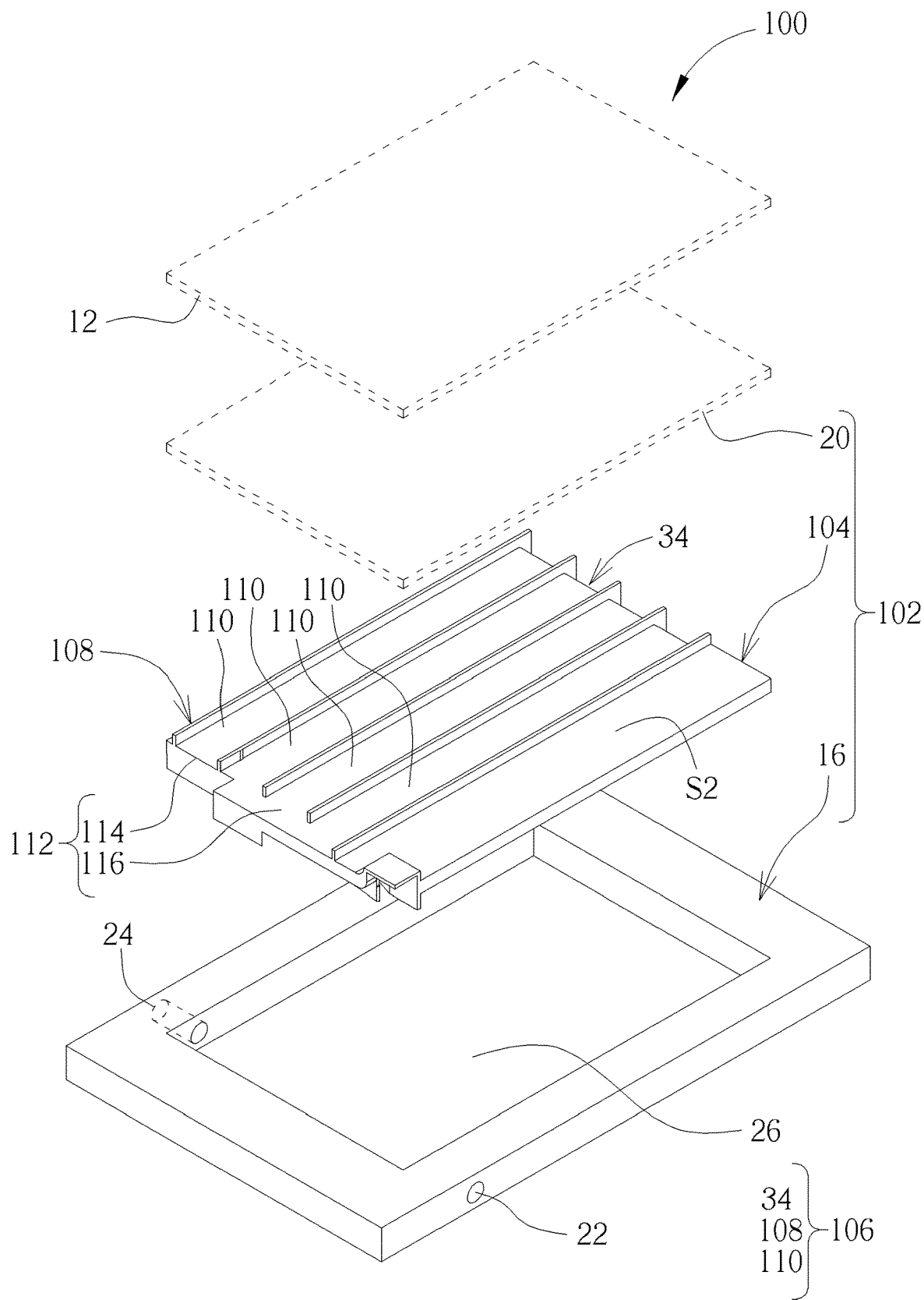
FIG. 4 is an exploded diagram of a motor controller according to another embodiment of the present invention.

It should be mentioned that the heat dissipating design of the present invention is not limited to the three-layer channel design mentioned in the aforesaid embodiment, which means the present invention could adopt a double-layer or single-layer channel design in another embodiment for simplifying the channel design of the heat dissipating module. For example, please refer to FIG. 4, which is an exploded diagram of a motor controller 100 according to another embodiment of the present invention. Components both mentioned in this embodiment and the aforesaid embodiment represent components with similar functions or structures, and the related description could be reasoned by analogy according to the aforesaid embodiment and omitted herein. In this embodiment, the motor controller 100 adopts a double-layer channel design. As shown in FIG. 4, the motor controller 100 includes the heat generating member 12 and a heat dissipating module 102. The heat dissipating module 102 includes the heat dissipating substrate 16, a first structural plate 104, and the first heat conductive plate 20. The first structural plate 104 has a first channel member 106 and is contained in the first container 26. The first channel member 106 includes the first flow guiding structure 30, a second flow guiding structure 108, and the first vertical channel structure 34. The second flow guiding structure 108 is formed on the second surface S2 of the first structural plate 104 facing the first heat conductive plate 20 and is communicated with the first vertical channel structure 34. To be more specific, in this embodiment, the second flow guiding structure 108 could have a plurality of linear channels 110 (but not limited thereto). Each linear channel 110 is communicated with the first vertical channel structure 34 and the outlet 24. Accordingly, the heat dissipating liquid flowing out of the first vertical channel structure 34 can flow through the plurality of linear channels 110 and flow out of the heat dissipating module 102 via the outlet 24. During this process, the first heat conductive plate 20, which covers the first structural plate 104 and is in contact with the heat generating member 12, can conduct the heat energy generated by the heat generating member 12 to the heat dissipating liquid for achieving the double-layer liquid cooling effect.

In practical application, for further enhancing the flow rectification effect, the heat dissipating module 102 could further include a second vertical channel structure 112. The second vertical channel structure 112 could have a vertical channel section 114 and a flow collection section 116. The vertical channel section 114 is formed in the first structural plate 104 corresponding to the outlet 24, and the vertical channel section 114 is communicated with the outlet 24 and at least one (two shown in FIG. 4, but not limited thereto) of the plurality of linear channels 110 adjacent to the outlet 24. The flow collection section 116 is formed on the second surface S2 of the first structural plate 104 and is communicated with the vertical channel section 114 and the remaining linear channels 110 away from the outlet 24. Via the aforesaid design, the heat dissipating liquid flowing through the linear channels 110 away from the outlet 24 can join together in the flow collection section 116, and can join together with the heat dissipating liquid directly flowing through the linear channels 110 adjacent to the outlet 24 to flow into the vertical channel section 114. Finally, the heat dissipating liquid can flow out of the heat dissipating module 102 via the outlet 24.

In another embodiment, the motor controller of the present invention could adopt a single-layer channel design. In brief, the motor controller in this embodiment could include the heat generating member and a heat dissipating module, and the heat dissipating module could include the heat dissipating substrate, the first structural plate, and the first heat conductive plate. The first structural plate has the first channel member and is contained in the first container, and the first channel member could only include the first flow guiding structure communicated with the inlet and the outlet of the heat dissipating substrate. In such a manner, the heat dissipating liquid can flow through the first flow guiding structure via the inlet and flow out of the heat dissipating module via the outlet. During this process, the first heat conductive plate, which covers the first structural plate and is in contact with the heat generating member, can conduct the heat energy generated by the heat generating member to the heat dissipating liquid for achieving the single-layer liquid cooling effect. As for the other related description for the motor controller in this embodiment (e.g. the structural plate design, the channel design, etc.), it could be reasoned by analogy according to the aforesaid embodiments and omitted herein.

Furthermore, the present invention could adopt a two-sided heat dissipating design, which means the structural plate design mentioned in the aforesaid embodiments could be applied to the top surface and the bottom surface of the heat dissipating substrate for achieving the two-sided heat dissipating effect. To be brief, in another embodiment, the heat dissipating substrate could have the first container and a second container, and the inlet and the outlet are communicated with the first container and the second container. The first container and the second container are formed on the top surface and the bottom surface of the heat dissipating substrate respectively. The heat dissipating module could include the first structural plate, the first heat conductive plate, a second structural plate and a second heat conductive plate (the related description for the first structural plate and the first heat conductive plate is provided in the aforesaid embodiments and omitted herein). The second structural plate has a second channel member and is contained in the second container. The second channel member is communicated with the inlet and the outlet. The second heat conductive plate covers the second structural plate and is in contact with another heat generating member. In such a manner, via the two-sided heat dissipating design, the heat dissipating liquid can flow through the first channel member and the second channel member respectively via the inlet and flow out of the heat dissipating module via the outlet. During this process, the first heat conductive plate covering the first structural plate and the second heat conductive plate covering the second structural plate can conduct the heat energy generated by the two heat generating members located on two surfaces of the heat dissipating module to the heat dissipating liquid, so as to achieve the liquid cooling effect of simultaneously performing heat dissipation on plural heat generating members. As for the other related description for the motor controller in this embodiment (e.g. the structural plate design, the channel design, etc.), it could be reasoned by analogy according to the aforesaid embodiments and omitted herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A heat dissipating module comprising:
   a heat dissipating substrate having an inlet, an outlet, and a first container, the inlet and the outlet being communicated with the first container respectively, the first container formed on a top surface of the heat dissipating substrate;
   a first structural plate contained in the first container and having a first channel member, the first channel member comprising a first flow guiding structure, a second flow guiding structure and a first vertical channel structure, the first flow guiding structure being formed on a first surface of the first structural plate facing the first container and being communicated with the inlet and the first vertical channel structure, the first flow guiding structure having a curved splitting section and a radial splitting section, the curved splitting section being communicated with the inlet, the radial splitting section being communicated with the curved splitting section and the first vertical channel structure, and a heat dissipating liquid flowing from the inlet into the first vertical channel structure by flowing through the curved splitting section and the radial splitting section sequentially and further flowing from the inlet to the outlet by flowing through the first flow guiding structure, the first vertical channel structure, and the second flow guiding structure sequentially; and
   a first heat conductive plate covering the first structural plate, the first heat conductive plate being in contact with a heat generating member for conducting heat energy generated by the heat generating member to the heat dissipating liquid, and the second flow guiding structure being formed on a second surface of the first structural plate facing the first heat conductive plate and being communicated with the first vertical channel structure and the outlet.

2. The heat dissipating module of claim 1, wherein the heat dissipating substrate is a metal component, the first heat conductive plate is an aluminum substrate, and the first structural plate is a plastic component formed by an injection molding process or a 3D printing process.

3. The heat dissipating module of claim 1, wherein the first channel member further comprises a second vertical channel structure, the second flow guiding structure has a plurality of linear channels, each linear channel is communicated with the first vertical channel structure, the second vertical channel structure is communicated with each linear channel and the outlet, and the heat dissipating liquid flows from the first vertical channel structure to the outlet by flowing through the plurality of linear channels and the second vertical channel structure sequentially.

4. The heat dissipating module of claim 3, wherein the second vertical channel structure has a vertical channel section and a flow collecting section, the vertical channel section is formed in the first structural plate corresponding to the outlet and is communicated with the outlet and at least one of the plurality of linear channels adjacent to the outlet, and the flow collection section is formed on the second surface of the first structural plate and is communicated with the vertical channel section and the remaining linear channels away from the outlet.

5. The heat dissipating module of claim 1, wherein the first channel member further comprises a second vertical channel structure, the second flow guiding structure has a plurality of curved channels, each curved channel is communicated with the first vertical channel structure, the second vertical channel structure is communicated with each curved channel and the outlet, and the heat dissipating liquid flows from the first vertical channel structure to the outlet by flowing through the plurality of curved channels and the second vertical channel structure sequentially.

6. The heat dissipating module of claim 5, wherein the second vertical channel structure is formed between the first flow guiding structure and the second flow guiding structure and has a plurality of first vertical channel sections and a flow collection section, the plurality of first vertical channel sections is communicated with the plurality of curved channels respectively, the flow collection section is communicated with the plurality of first vertical channel sections and the outlet, and the heat dissipating liquid flows from the first vertical channel structure to the outlet by flowing through the plurality of curved channels, the plurality of first vertical channel sections, and the flow collection section sequentially.

7. The heat dissipating module of claim 6, wherein the second flow guiding structure further has a linear channel, the second vertical channel structure further has a second vertical channel section, the second vertical channel section is communicated with the linear channel and the plurality of first vertical channel sections, and the heat dissipating liquid flows from the first vertical channel structure into the second vertical channel section by flowing through the linear channel.

8. A motor controller adopting a liquid cooling method for controlling power output of an electric vehicle motor, the motor controller comprising:
  a heat generating member; and
  a heat dissipating module comprising:
    a heat dissipating substrate having an inlet, an outlet, and a first container, the inlet and the outlet being communicated with the first container respectively, the first container formed on a top surface of the heat dissipating substrate;
    a first structural plate contained in the first container and having a first channel member, the first channel member comprising a first flow guiding structure, a second flow guiding structure and a first vertical channel structure, the first flow guiding structure being formed on a first surface of the first structural plate facing the first container and being communicated with the inlet and the first vertical channel structure, the first flow guiding structure having a curved splitting section and a radial splitting section, the curved splitting section being communicated with the inlet, the radial splitting section being communicated with the curved splitting section and the first vertical channel structure, and a heat dissipating liquid flowing from the inlet into the first vertical channel structure by flowing through the curved splitting section and the radial splitting section sequentially and further flowing from the inlet to the outlet by flowing through the first flow guiding structure, the first vertical channel structure, and the second flow guiding structure sequentially; and
    a first heat conductive plate covering the first structural plate, the first heat conductive plate being in contact with the heat generating member for conducting heat energy generated by the heat generating member to the heat dissipating liquid, and the second flow guiding structure being formed on a second surface of the first structural plate facing the first heat conductive plate and being communicated with the first vertical channel structure and the outlet.

9. The motor controller of claim 8, wherein the heat dissipating substrate is a metal component, the first heat conductive plate is an aluminum substrate, and the first structural plate is a plastic component formed by an injection molding process or a 3D printing process.

10. The motor controller of claim 8, wherein the first channel member further comprises a second vertical channel structure, the second flow guiding structure has a plurality of linear channels, each linear channel is communicated with the first vertical channel structure, the second vertical channel structure is communicated with each linear channel and the outlet, and the heat dissipating liquid flows from the first vertical channel structure to the outlet by flowing through the plurality of linear channels and the second vertical channel structure sequentially.

11. The motor controller of claim 10, wherein the second vertical channel structure has a vertical channel section and a flow collection section, the vertical channel section is formed in the first structural plate corresponding to the outlet and is communicated with the outlet and at least one of the plurality of linear channels adjacent to the outlet, and the flow collection section is formed on the second surface of the first structural plate and is communicated with the vertical channel section and the remaining linear channels away from the outlet.

12. The motor controller of claim 8, wherein the first channel member further comprises a second vertical channel structure, the second flow guiding structure has a plurality of curved channels, each curved channel is communicated with the first vertical channel structure, the second vertical channel structure is communicated with each curved channel and the outlet, and the heat dissipating liquid flows from the first vertical channel structure to the outlet by flowing through the plurality of curved channels and the second vertical channel structure sequentially.

13. The motor controller of claim 12, wherein the second vertical channel structure is formed between the first flow guiding structure and the second flow guiding structure and has a plurality of first vertical channel sections and a flow collection section, the plurality of first vertical channel sections is communicated with the plurality of curved channels respectively, the flow collection section is communicated with the plurality of first vertical channel sections and the outlet, and the heat dissipating liquid flows from the first vertical channel structure to the outlet by flowing through the plurality of curved channels, the plurality of first vertical channel sections, and the flow collection section sequentially.

14. The motor controller of claim 13, wherein the second flow guiding structure further has a linear channel, the second vertical channel structure further has a second vertical channel section, the second vertical channel section is communicated with the linear channel and the plurality of first vertical channel sections, and the heat dissipating liquid flows from the first vertical channel structure into the second vertical channel section by flowing through the linear channel.

* * * * *